United States Patent [19]

Spencer et al.

[11] 4,380,066
[45] Apr. 12, 1983

[54] DEFECT TOLERANT MEMORY

[75] Inventors: David H. Spencer, Lebanon; Marvin E. Steiner, East Brunswick, both of N.J.; Donald H. Lang, FranklinSquare, N.Y.

[73] Assignee: Burroughs Corporation, Detroit, Mich.

[21] Appl. No.: 212,772

[22] Filed: Dec. 4, 1980

[51] Int. Cl.³ .................... G06F 11/20; G11C 29/00
[52] U.S. Cl. .................... 371/10; 364/900; 365/200
[58] Field of Search ........... 371/10; 364/200, 900; 365/200, 201

[56] References Cited

U.S. PATENT DOCUMENTS

| | | | |
|---|---|---|---|
| 3,350,690 | 10/1967 | Rice | 364/900 |
| 3,422,402 | 1/1969 | Sakalay | 364/900 |
| 3,633,175 | 1/1972 | Harper | 364/200 |
| 4,051,354 | 9/1977 | Choate | 371/10 |
| 4,051,461 | 9/1977 | Hashimoto et al. | 364/900 |
| 4,310,901 | 1/1982 | Harding et al. | 365/200 |

*Primary Examiner*—Charles E. Atkinson
*Attorney, Agent, or Firm*—David G. Rasmussen; K. R. Peterson; E. M. Chung

[57] ABSTRACT

The invention is a defect tolerant memory for a computer system. The defect tolerant memory has a main memory, a redundant memory and a mask memory. The redundant memory receives and stores data redundant to that addressed to defective cells in the main memory. The redundant memory has multiple memory levels and uses a randomness technique to store redundant data for all chips of the main memory. The mask memory stores the location of each defect of main memory and indicates when a defective word is addressed in main memory. The mask memory is made up of multiple bit mask memories each cooperating with one of the redundant memory levels. Each bit-mask memory has multiple sub-memory units which use a randomness technique to store the addresses of defects in main memory.

12 Claims, 9 Drawing Figures

| REDUNDANCY MEMORY-16K ADDRESS ||||
|---|---|---|---|
| | # OF OVERLAYS | INDIVIDUAL CELL DEFECTS | PROBABILITY OF OCCURANCE |
| 2 DEFECTS PER DEVICE | SINGLES | 906.64 | 100% |
| | DOUBLES | 25.9 | 100% |
| | TRIPLES | .5 | 42% |
| | QUAD'S | .015 | 1.6% |
| 3 DEFECTS PER DEVICE | SINGLES | 1312.5 | 100% |
| | DOUBLES | 58.37 | 100% |
| | TRIPLES | 1.59 | 80% |
| | QUAD'S | .04 | 3.1% |
| | QUINT'S | .015 | -0% |
| 4 DEFECTS PER DEVICE | SINGLES | 1707.84 | 100% |
| | DOUBLES | 99.97 | 100% |
| | TRIPLES | 3.87 | 99% |
| | QUAD'S | .14 | 13.5% |
| | QUINT'S | 0 | -0% |
| | SIXT'S | | |

_Fig.8_

| MASK MEMORY ||||
|---|---|---|---|
| | # OF OVERLAYS | INDIVIDUAL CELL DEFECTS | PROBABILITY OF OCCURANCE |
| 2 DEFECTS PER DEVICE | SINGLES | 599.43 | 100% |
| | DOUBLES | 142.7 | 100% |
| | TRIPLES | 21.28 | 100% |
| | QUAD'S | 2.5 | 96% |
| 3 DEFECTS PER DEVICE | SINGLES | 721 | 100% |
| | DOUBLES | 211.1 | 100% |
| | TRIPLES | 64.1 | 100% |
| | QUAD'S | 14.2 | 100% |
| | QUINT'S | 3.4;.625 | 98%;40% |
| 4 DEFECTS PER DEVICE | SINGLES | 762.2 | 100% |
| | DOUBLES | 343.3 | 100% |
| | TRIPLES | 104.4 | 100% |
| | QUAD'S | 23.5 | 100% |
| | QUINT'S | 3.7 | 100% |
| | SIXT'S | .63 | 46% |

_Fig.9_

DEFECT TOLERANT MEMORY

BACKGROUND OF THE INVENTION

1. Field of the Invention

The invention involves a defect tolerant memory for a computer system. More specifically, the defect memory has a redundant memory and mask memory which use randomness techniques for storing respectively redundant information and addresses of defects.

2. Description of the Prior Art

As memory density and the size of the chips in the memories increase, the number of defects in the memory and chip also increases. An example is a state-of-the-art 128K memory having 60 bit words which uses 480 16K memory chips. It is impractical to attempt to procure and use 16K chips with no defects. To provide for correction of defective cells in the memory chips there must be a means for storing the locations of such defects and also for storing information redundant to that in the defective locations.

U.S. Pat. No. 4,051,354 dicloses a chip which performs such a function. In this patent, a chip array has redundant rows and/or columns of cells and a programmed logic array for decoding the addresses of defective cells. A redundant column (or row) may contain redundant information for various defective cells occurring randomly in different rows (or columns) of the main columns of the array. This is a randomness technique expecting one or less defects per row per redundant column. The patent uses this technique for single bit defects in single chips. If multiple chips are used, as in a multi-chip memory, each of the chips must have similar redundant rows/columns and circuitry. This arrangement becomes complex and costly for large memories. Furthermore, if defect randomness exceeds the capability of the chip redundancy the chip is scrapped.

SUMMARY OF THE INVENTION

The present invention is a defect tolerant memory which greatly reduces the complexity and cost of circuitry necessary for the redundant feature of a memory.

The defect tolerant memory includes a standard main memory into which data is written or from which data may be read. The main memory receives address commands, stores data and provides the addressed data as output.

A redundant memory receives and stores data redundant to that addressed to the defective cells in the main memory. The redundant memory has multiple memory levels and uses a randomness technique to store redundant data for all chips of the main memory. In the randomness technique each of the memory levels have similar addresses with each address representative of a set of similar addresses in main memory. If multiple defects occur in the set each memory level will contain redundant data for one of the multiple defects.

A mask memory stores the location of each defect of main memory and indicates when a defective word is addressed in main memory. The mask memory is made up of multiple bit-mask memories, each cooperating with one of the redundant memory levels. Each bit-mask memory has multiple sub-memory units which use a randomness technique to store the addresses of defects in main memory. In the randomness technique, each sub-memory address is representative of a segment of main memory. Each address stores a word indicative of the specific address of a defective word in the respective segment of main memory and a bit point indication identifying the bit position of the defective cell. If multiple defects occur in the segment of main memory, information for each defect will be stored in a different sub-memory.

When the mask memory indicates that a defective word is addressed in main memory, it provides a bit-position code to a bit-correction unit which then selects redundant information.

The bit-correction unit receives the output of the main memory, the mask memory and the redundant memory, It passes addressed words from main memory with no defective bits and replaces bits in the addressed words from defective cells.

The invention uses a novel randomness technique for both the redundant memory and for the mask memory. The way the randomness technique is applied allows all defects in main memory to have redundant information in one redundant memory and all stored addresses of defects to be in one mask memory. This allows the problem of defects to be treated on a memory system basis rather than on an individual chip basis as in the prior art. Additionally, the invention looks for defects on the basis of defective words in the total memory system rather than on the basis of defective bits in a chip. Another advantage of the invention is that the main memory, redundant memory and mask are all addressed directly by the address commands and address translation is eliminated. This speeds operation. In addition, by the use of probability computations, the number of levels of redundant memory and number of mask sub-memory units can be estimated accurately. This adds predictability to the production line for defect tolerant memories.

The novel structural features of the invention are the redundant memory with multiple memory levels, the mask memory which has bit-mask memories made up of sub-memory units, and the combination of the redundant memory and mask memory.

BRIEF DESCRIPTION OF THE DRAWINGS

FIG. 7 is a diagrammatic view of the structure of each mask sub-memory unit.

FIG. 8 is a table of a probability analysis done to indicate the number of redundancy levels of redundant memory needed.

FIG. 9 is a table of a probability analysis done to indicate the number of sub-memory units needed for each bit mask memory of the mask memory.

DETAILED DESCRIPTION OF THE PREFERRED EMBODIMENT

Figure 1:
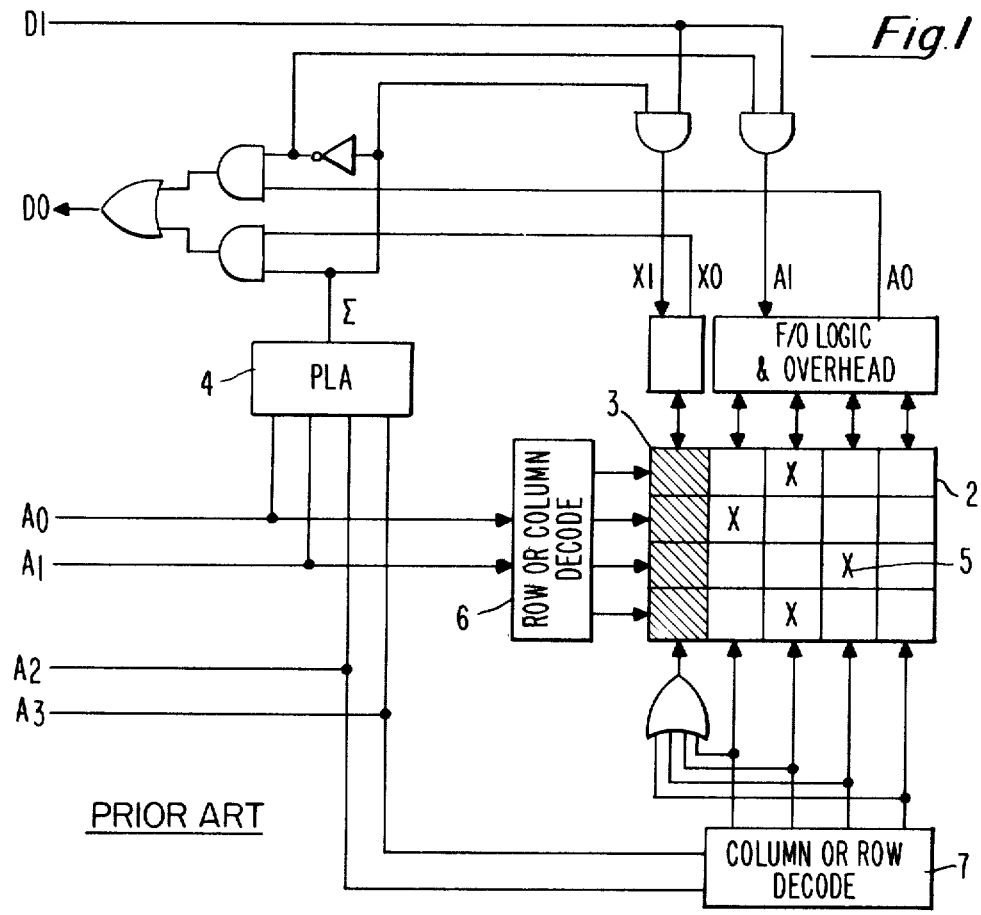
FIG. 1 is a diagram of the prior art.

FIG. 1 shows the defect tolerant array of U.S. Pat. No. 4,051,354. This is a cell addressable array 2 arranged in rows and columns of cells with a redundant column of cells 3. A programmed logic array (PLA) 4 detects the addresses of defective bits 5. Address commands are fed to the PLA and to array 2 through decoders 6 and 7.

In operation, data addressed to defective cells 5, is stored in column 3. For example, in the top row, the defect may occur randomly in any column and the contents of the defective cell will be stored in the top cell of column 3. Other embodiments shown in the patent illustrate how multiple defects in a row or column may be taken care of by multiple redundant rows or columns. In addition, embodiments are shown where several of the defect tolerant memory arrays are arranged in parallel to form multi-array memories.

The patent shows a randomness technique for replacing defective cells. The redundant column will hold data for defective cells occurring randomly in columns of the rest of the array. Each cell of the redundant column is representative of a set of corresponding cells in the other columns of the memory.

The prior art patent is directed to correcting single cell defects on a single chip. When a multi-array memory is involved the patent handles this by putting individual arrays with redundant rows (columns) in parallel on a single chip with common decoders. With the chips in parallel the whole system gets complicated and costly. An illustration of the problems could be seen in a 128K word memory having 60 bit words which uses 16 K bit chips. A complex parallel arrangement of 480 chips would be necessary. The chips would each have to have decoding and defect tolerant logic because of the 60 bit words.

The present invention does the opposite and solves the above problem by handling all defects on a total memory system basis with one redundant memory array and one mask memory.

In addition, the prior art patent handles defects on a bit-by-bit basis and all address commands must be decoded to each particular bit. The decoding takes memory chip area and is unnecessary in the present invention. The present invention addresses words rather than bits and directly addresses the main memory, redundant memory, and mask memory. This eliminates multiple decoders, each required to completely detect any combination of addresses found defective.

Figure 2:
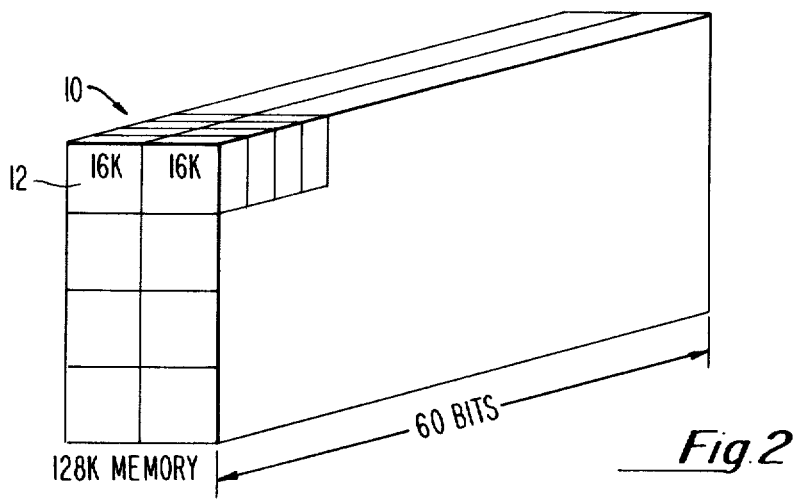
FIG. 2 is a perspective view of a 128K memory.

FIG. 2 shows a state-of-the-art 128K memory unit 10 which may be used in the defect tolerant memory system (as an example). 480 16K memory chips 12 make up the 128K memory. Memory chips 12 are stacked sixty deep to provide a 60 bit word for each of the 128K memory locations. A defect may occur in any of the 16K locations on any chip and hence may be in any bit location in any word. In addition, an entire column or row within any chip may be defective.

Figure 3:
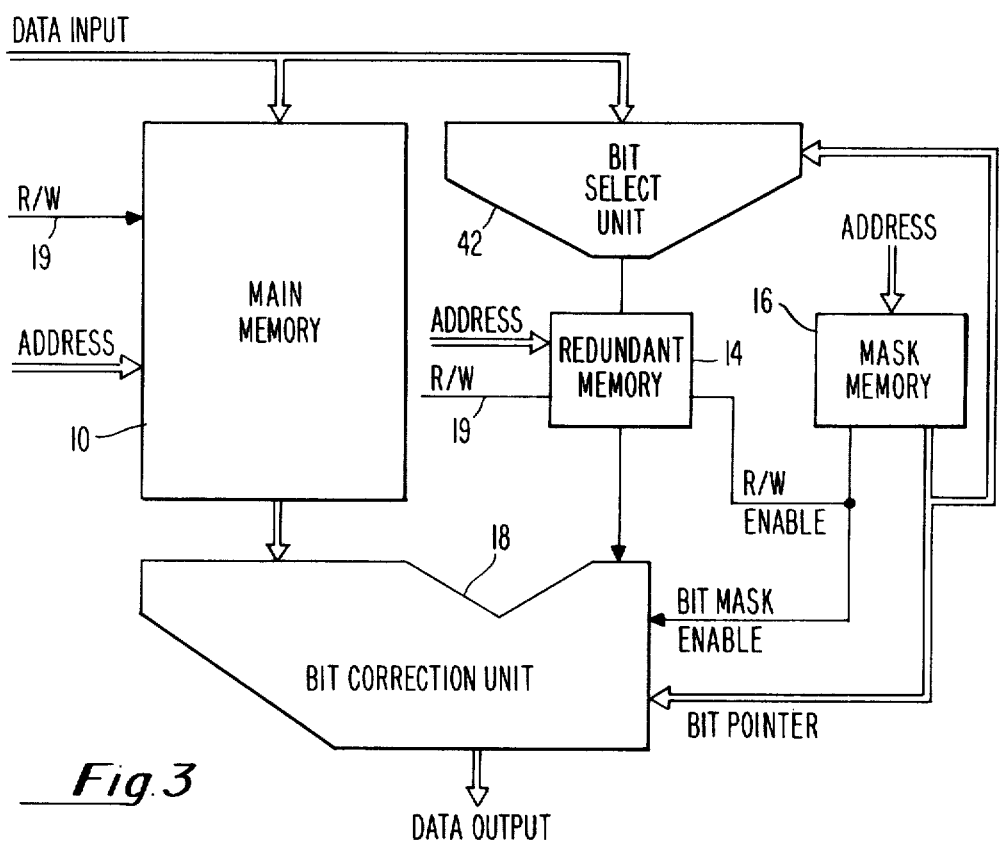
FIG. 3 is a block diagram of the main components of a defect tolerant memory.

FIG. 3 shows the main elements of the defect tolerant memory: a main memory 10, a redundant memory 14, a mask memory 16, a bit-correction unit 18, and a bit-select unit 42. A read/write control line 19 indicates whether a word is being written into or read from main memory. Redundant memory 14 contains data which is redundant to the data addressed to the defective cells in main memory 10. Mask memory 16 indicates all of the addresses of the defective cells of the main memory. An address command is fed to main memory 10, redundant memory 14, and mask memory 16. The mask memory will check to see whether the address command is addressing one of the defective cells in main memory. If correspondence is found, and the address command indicates that a word is to be read from main memory, an output (bit pointer) from the mask memory is provided to bit-correction unit 18. The bit-correction unit will place the correct data from the redundant memory into the proper bit positions of the defective word coming from the output of main memory 10. If correspondence is found and the address command indicates that a word is to be written into main memory, mask memory 16 provides a write enable to redundant memory 14, and an output (bit pointer) to the bit-select unit 43. The bit-select unit 42 selects bit positions from the data source to be written into redundant memory 14.

Figure 4:
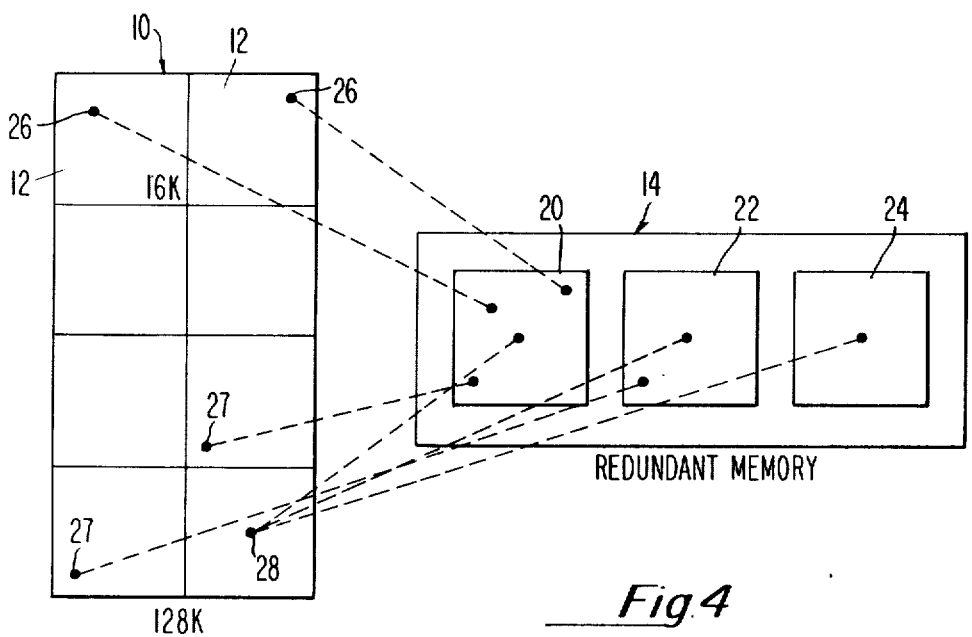
FIG. 4 is a diagrammatic view illustrating how each address location of the memory levels of the redundant memory corresponds to several address locations of main memory.

FIG. 4 provides more details (as an example) of the relationship of main memory 10 to redundant memory 14. The main memory can be thought of as being broken into eight sub-sets of memory, each being 16K address locations. These are each designated by the numeral 12 (i.e. chip). The redundant memory 14 is made up of several levels of 16K memories 20, 22, and 24. For purposes of illustration, only redundant memory 20 is described. Each of the 16K address locations of memory level 20 (and 22, 24) corresponds to one address location in the same position of each of the eight sub-sets 12 of the main memory. In other words, a specific address in main memory 10 will share the identical address of redundant memory level 20 with eight of the sub-set memories 12 of main memory 10.

The figure shows a number of defective cell locations in the 128K main memory. For illustration, two are numbered 26. The locations of these defective cells correspond to locations in the redundant memory level 20 with the correspondence being shown by the dashed lines. Redundant memory 14 will contain data addressed to the corresponding defective bits in main memory 10.

A problem arises however, where two defective cells 27 in the main memory may have the same sub addresses in different sub-set memories 12. In this case it is impossible to store two sets of data into one address in the redundant memory. This is illustrated where the two defective cells 27 have the same address in redundant memory. The dashed lines show the incoming data would have to be stored in corresponding address locations in two memory levels 20, 22. The first memory level 20 would have data for one address of the main memory and the second memory level 22 would have data for the second address of main memory. The use of multiple levels 20, 22, 24 of the redundant memory allows up to three possible defects of the main memory to have the same address in the redundant memory. Similarly, if three defects occurred in the 60 stacked chips for one 60 bit word in main memory, shown as defect 28, the three defects would have redundant data stored in memory levels 20, 22, 24.

The redundant memory uses a randomness technique for storing data since each location in redundant memory stores data for defective cells occurring randomly in the respective locations in the eight sub-sets 12 of main memory. In this example each of the sub-sets 12 is 60 bits deep mapping 8 times 60 cells (480) into one of three possible redundant memory cells.

The number of memory levels used in redundant memory is based on information derived prior to the actual construction of the main memory. It is determined statistically prior to the construction of the main memory what the probability is of having defects in the various sub-sets 12 at the same address by large lot testing of memory chips with defects randomly occurring. For the particular example given, a 128K main memory and a 16K redundant memory the number of levels found to be needed is approximately three with a lot of chips having three defects per chip average. Normally, there will not be more than three defective cells having the same sub-address of the sub-sets 12. Basically, this knowledge is used as a manufacturing and production aid. The assembly line can be set up to manufacture memory systems using three levels of redundant memory with a very high probability that when all of the defects in the memory are tabulated there will not be more than three levels of redundant memory needed. If it is found in a particular machine being manufactured that four defects have occurred in a particular address, physically one of the chips will be much changed to alleviate this situation. But this will occur at less than the normal manufacturing rework rate. Therefore, a production line set-up using three levels of memory will be sufficient.

Figure 5:
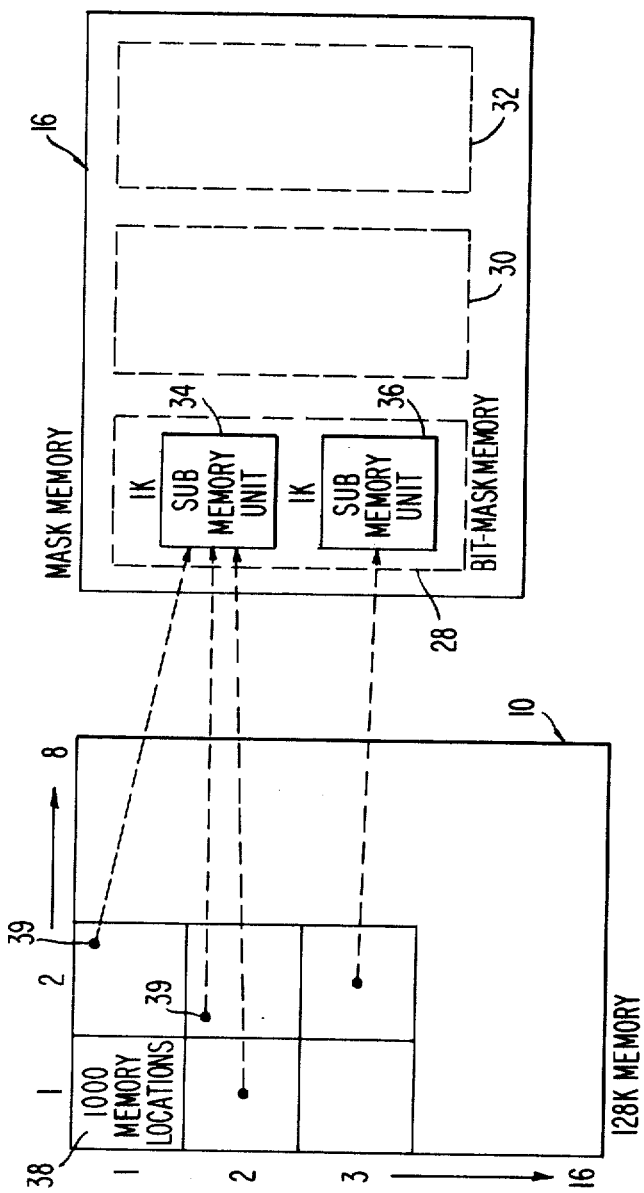
FIG. 5 is a diagrammatic view of the addressing scheme of the mask memory.

FIG. 5 describes the relationship of the addressing scheme of the 128K main memory 10 to that of the mask memory 16. This relationship operates on the same randomness principle as the redundant memory. The mask indicates the address of each of the defects in the 128K memory and can locate it to its exact bit position of the word, For this example, it is made up of three bit-mask memories 28, 30, 32, each operating independently and cooperating with a different one of redundant memory levels 20, 22, 24, shown in FIGS. 4 and 6. Each of the bit-mask memories contains sub-memory units. For illustration purposes only, sub-memory units 34, 36 of bit-mask memory 28 are shown. The method by which the mask memory stores the precise locations of the defective cells of main memory 10 is as follows. Each sub-memory unit 34, 36 of the mask memory has 1K of memory containing 13 bit words. The main memory 10 can be thought of as being broken into 128 sub-sets 38 of memory, each having 1K addresses. Each of the 1K addresses of sub-memory units 34, 36 correspond to an address in each of sub-sets 38. Since there are 128 sub-sets each address location of sub-memory units 34, 36 is representative of 128 address locations in the main memory. A number of defects are illustrated by the designator 39. Each defect has a 13 bit descriptor stored at the corresponding address in sub-memories 34, 36. The first 7 bits will indicate which sub-set of the 128 sub-sets of main memory contains the defect. The last 6 bits of the word will indicate the bit position of the defect (i.e. for the 60 bit word). A problem occurs however, where defects may occur at the same sub-address (1 of 1K) in different sub-sets of main memory. The two bottom defects in the figure are shown as having the same sub-address. The descriptor for both can't be stored at one address in sub-memory 34, so the second defect descriptor is stored in the second sub-memory 36, as shown by the dashed lines. A third defect's descriptor would be in a third sub-memory unit (not shown) or be removed during manufacturing or be corrected in the next level of redundant memory controlled by bit-mask memory 30 or 32. As will be explained subsequently, an address command $A_0-A_9$ addresses the 1K sub-memory units 34, 36. The same portion of the address command will address the corresponding locations within each of the 128 sub-sets of main memory. The remaining portion of the address command $A_{10}-A_{16}$ is the seven bit code stored in the first 7 bits of the descriptor.

Figure 6:
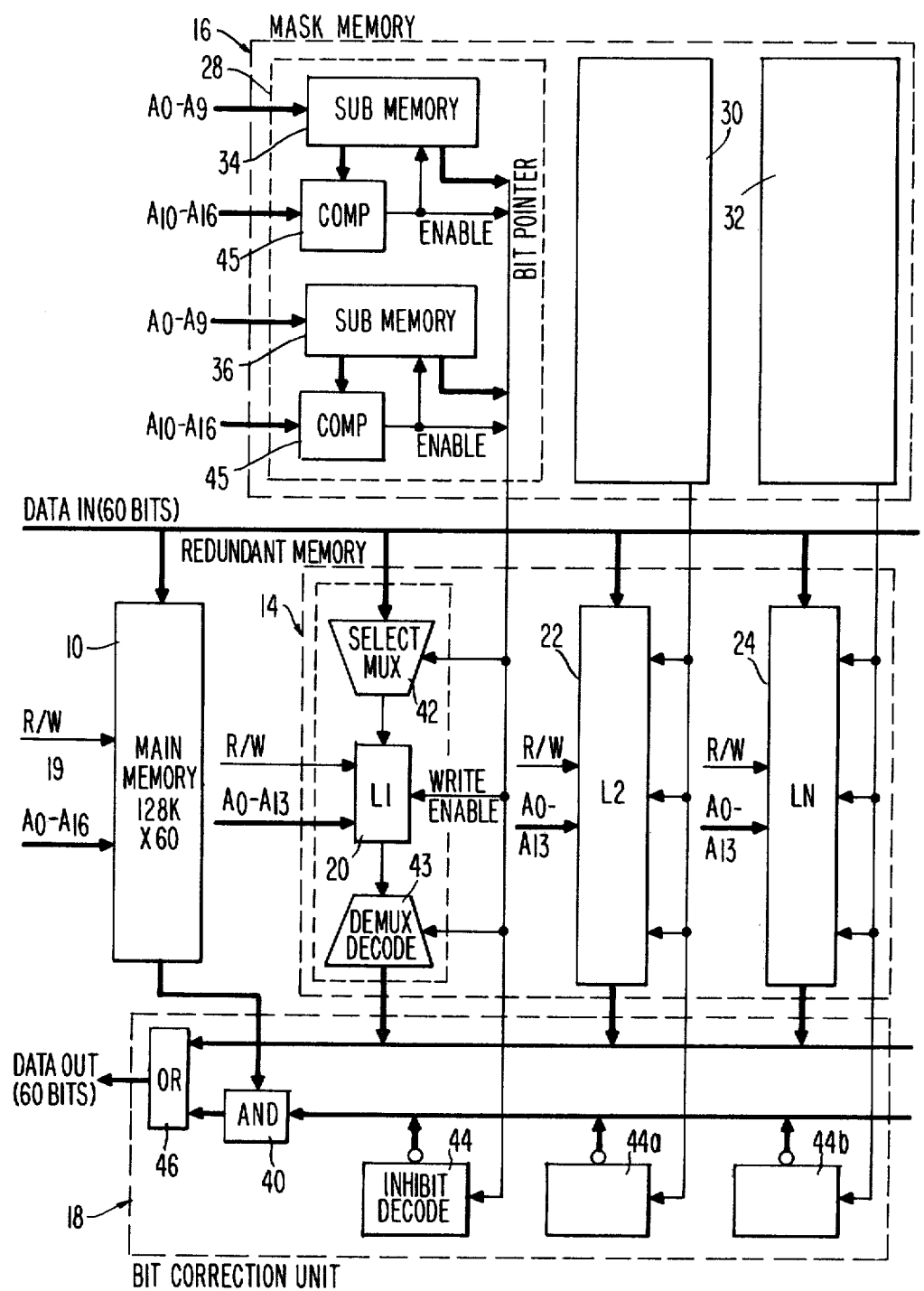
FIG. 6 is a detailed block diagram of the defect tolerant memory.

FIG. 6 shows a detailed block diagram of the defect tolerant memory. An address command with bit positions $A_0-A_{16}$ is given an indication whether it is to be a read or write command by read/write line 19. The address command is then provided to main memory 10. A portion of the address command $A_0-A_{13}$ is provided to address the redundant memory 14. Another portion of the address command, bits $A_0-A_9$ is provided to address mask memory 16. In addition, bits $A_{10}-A_{16}$ are provided to mask memory 16.

In the main memory, if the address command is a read command it will call out a 60 bit word from the 128K memory and provide this word as an output to an AND circuit 40 in bit-correction unit 18. If the address command is a write command, data will be written into the addressed location in main memory.

The redundant memory 14 contains multiple memory units $L_1, L_2, L_N$ which are respectively 20, 22, and 24. Each multiple memory unit has associated with it a select mux 42 and a demux decode unit 43. For clarity, each whole assembly will be designated as $L_1, L_2, L_N$. The select units 42 receive a 60 bit word of data in. In addition, they receive bit descriptors from mask memory 16 if a write address command has addressed a word in main memory having a defective cell in it. Normally, the data is not written into the redundant memory but if this input is received data is written. The output of each select unit 42 is fed to its respective redundant memory unit $L_1, L_2$ or $L_N$ for storage.

Bit-mask memories 28, 30, 32 each cooperate respectively with a different one of redundant memory levels $L_1, L_2, L_N$. When a read address command is received in bit-mask memories 28, 30, 32 and finds the corresponding stored sub-address of a defective word in one or more of the bit-mask memories, an output is provided from that bit-mask memory to the decode unit 44 of bit-correction unit 18 for use in correcting the defective word from main memory 10. Most defects in the main memory are single defects having no common sub-address and will be stored in $L_1$. The respective addresses for these defects are stored in bit mask memory 28. If two defects have the same sub-address, the address of the first defect will be stored in bit mask memory 28 and the second will be stored in bit mask memory 30. The redundant data will be stored in memory levels $L_1, L_2$, respectively. Likewise, a triple defect additionally involves level $L_N$ and bit-mask memory 32. When a read address command is fed to mask memory 16, bit mask memories 28, 30, 32 will search to see if the address of a defect is present as follows. Bits $A_0-A_9$ are fed simultaneously to bit-mask memories 28, 30, 32, and address a location in sub-memory units 34, 36 of each of the bit mask memories. As explained previously, each of the thousand addresses represents a set of 128 words in main memory. The first 7 bits (i.e. address field) of the addressed word in mask memory contains the specific address of a defect in the 128 word set in the main memory. The address field of the addressed word found in any of sub-memory units 34, 36 of each of the bit-mask memories 28, 30, 32 is fed to a comparator. If the address field is the same as bits $A_{10}-A_{16}$ a comparison is found, thus indicating that a defect is present in the particular address in the main memory. The comparator 45 provides an enable to select unit 42 of the redundant memory and to decode unit 44 of the bit-correction unit 18.

The last portion, the bit pointer, of the addressed word in each of bit-mask memories 28, 30, 32 is fed to decode unit 44 of the bit correction unit 18 and also to select units 42. In decode unit 44, if there is an indication that a defect is present in the addressed word in main memory, the decode unit will forward bit point information to AND gate 40 which will remove that particular bit from the main memory word. This word will be passed on from AND gate 40 to OR gate 46. The correct redundant data from redundant memory 14 will pass through decode unit 44 to OR gate 46 and be replaced in the word, thus, giving a corrected word as an output of the bit correction unit.

FIG. 7 shows the structure of each sub-memory 34, 36 of bit-mask memories 28, 30, 32. For example, address 1, memory, is the address for a 13 bit word. The first 7 bits of the word are the address field for one of the 128 addresses of the corresponding set in main memory. In other words, this pin-points the exact location of a defect in main memory. The last 6 bits of the word is the bit point field indicating which one of the 60 bits of the main memory word is defective. Addresses 2 through 1K are of similar structure.

FIGS. 8, 9 show tables of the results of a probabalistic analysis done to indicate the number of redundancy levels and sub-memory units of each bit-mask memory needed for the defect tolerant memory prior to manufacture of a machine. For purposes of this analysis assume that the main memory is the 128K memory shown in FIG. 2 and the 16K redundant memory of FIG. 4. The 128K memory uses 480 chips having an average of two defects per device. The actual statistical number of defects per device may be determined either from manufacturer's data or by lot sampling techniques. Using the figure of two defects per device, a probabalistic analysis is used to determine the probability of defects occurring in the same location in more than one chip in the main memory corresponding to the same address in redundant or bit-mask memory. FIG. 8 shows that out of 960 defects there will be approximately 906 single defects occurring which do not require the same locations in the chips in redundant memory. The table also shows that double defects will occur requiring the same location in redundant memory in 25 separate locations. It is further shown that three defects will occur requiring the same location about 0.5 times. The probability of four defects occurring is small.

These statistics show that the probability of having four chips with defects requiring the same location is very low. Therefore, only three levels of redundant memory are needed. The first level of redundant memory (i.e. $L_1$ of FIG. 5) would store all of the single defects and one of the defects of the double or triple defects. Second redundant level $L_2$ would store the second defect of each double or triple defect. $L_3$ would store the third defect of each triple defect.

By knowing that three redundant memories have a high probability of being able to store information for all possible defects in main memory, it is possible in the manufacturing process to construct all computers with three redundant memory levels. This allows for planning and certainty in the manufacturing process. If after checking the locations of the defects in main memory after manufacture, it is discovered that there are more defects in a single address location than there are numbers of redundancy levels, then physically a chip will be replaced in the main memory such that the number of redundancy levels will be sufficient. Since the probability of this occurrance will be very small it is expected that in the manufacturing process very few memories wil require replacement of chips. The probability of three chips with defects in the same location is not as low for a four defects but it still may be possible to use only two levels of redundant memory. If it is decided that only two redundancy levels are needed the probability rises that a chip will have to be replaced. However, each of the memories produced will have one less chip in redundant memory. If the defects per device rise to 3 then the probability of having to replace a chip rises to 3.1%. These are balancing factors that must be considered in determining the number of redundancy levels needed. Other factors include the quality of chips being purchased and the size of the chip being used for the redundant memory.

An analysis to determine the number of multiple sub-memory units in each bit mask memory is similar to that used to determine the number of redundancy levels needed. The difference is that the mask memory may use smaller memory levels, for this example, 1K addresses each. In addition, there will be a separate analysis for each bit mask memory since a separate bit mask memory is associated with each level of redundant memory.

The probability analysis consists of a computer program simulation of a defect tolerant memory with unlimited numbers of bit-mask levels and redundant memory levels. The program creates storage tables for each level, uses a random number generator to simulate defects in the main memory and records them in the tables as generated, similar to FIGS. 4 and 5. The incidence of overlay indicates the number of levels used. By running the program a sufficiently large number of times the probability of occurrance of the use of each of the levels is shown.

For optimum design when the exact lot defect distribution is known those figures can be used instead of a random number generator. This method would give more accurate results when chip defects occur in sets, rows, or columns of the array of cells, that is a nonlevel random distribution.

In operation, prior to construction of the example machine, a probabalistic analysis, as described in FIGS. 8, 9, is done to establish how many levels of redundant memory and mask sub-memories are needed for the desired defect tolerant memory. Production lines are then set up to manufacture the main memory 10, redundant memory 14 and the mask memory 16. The main memory 10 is assembled with 480 chips to form a 128K memory, 60 bits deep. The chips of main memory 10 are then tested in place to determine the location of defective cells. The addresses of the defective cells are then analyzed according to the relationship described in FIG. 4 to establish whether these are single defects, double defects or triple defects. For the single defects it is expected that their data information will be stored in memory level $L_1$. Therefore, the sub-addresses for all of these defects may be stored in bit mask memory 28, which cooperates with memory level $L_1$ if they themselves don't overlay. For double defects, their data may be stored in redundant memory levels $L_1$ and $L_2$ and the defect sub-addresses may be stored in bit mask memories 28, 30, respectively. For triple defects, redundant memory levels $L_1$, $L_2$, $L_N$ and mask memories 28, 30, 32 must be used.

In bit-mask memories 28, 30, 32, the defects are analyzed according to the relationship of the main memory and bit mask memory described in FIG. 5. For example, in bit mask memory 28, single defects in sub-sets 38 of main memory 10 will have their sub-addresses stored in sub-memory unit 34. If there are two defects with the same sub-set 38 address, then the sub-address of one of the defects will be stored in sub-memory unit 34, and the second sub-address will be put in sub-memory 36. If more than two defects, otherwise intended for $L_1$, overlay sub-addresses in bit masks 34 and 36 then they must be assigned to bit mask 30 or 32 and the data will then be stored in redundant memory levels $L_2$ or $L_3$. This is possible without overlay because the redundant memory is usually larger than the bit mask memory. The same technique is used in mask memory 30 and 32, which cooperate with redundant memory levels $L_2$, $L_N$, respectively.

After the defect tolerant memory is constructed and the defective cell addresses are stored in mask memory 16, the defect tolerant memory is ready for operation. Data may be written into the defect tolerant memory without regard to defective cells. Main memory 10 will receive the output of a data source and will have the data written into main memory by a "write" address command. The output of the data source is also fed to redundant memory 14 through a bit-selector 42. Normally, the "write" address command also goes to the mask memory which determines if a word having a defect has been addressed. If such a word is addressed, the mask memory will provide an output to the select unit 42 of redundant memory 14 and the data will be written into the appropriate memory level $L_1$, $L_2$, $L_N$. Therefore, only data which is addressed to defective cells of main memory 10 is stored in redundant memory 14.

If data is to be read from main memory 12, a "read" address command is fed to the defect tolerant memory. Main memory 10 receives the address command and reads out the appropriate address words to AND gate 40. It is unknown at this point whether the addressed word has a defect and the defect tolerant memory checks to see whether the addressed word contains a defect.

To accomplish this, the "read" address command is fed to the mask memory 16. The address command will address one of the memory locations in sub-memories 34, 36 of bit-mask memories 28, 30, 32, and read out its contents. The first 7 bits will be used to determine if a defective word has been addressed. The second 6 bits will be the bit position of the defect. The first 7 bits are fed to comparator 45 where they are compared with bits $A_{10}$–$A_{16}$ of the address command. A comparison indicates that a defective word has been addressed. A defective word may be found for each of mask memories 28, 30, 32 simultaneously since memory levels $L_1$, $L_2$, $L_3$ may have data stored at the same address. This would occur if a particular defective word had three bad bits. Each would be stored in a different memory level.

The comparator provides an indication from each mask memory to its associate bit decoder 44 that a comparison has been found. The "read" address command is also fed to memory levels $L_1$, $L_2$, $L_N$. The same memory location is addressed in each one. The signal from comparator 45 in the mask will indicate to the decoder 44 which of the respective memory levels $L_1$, $L_2$, $L_N$ should be fed to OR gates 46. Data from all three memory levels would be forwarded if three defects were present. The bit point field from the mask will be fed to decode unit 44 and on to AND gate 40 where the defective data will be inhibited from the word being read from main memory. The data from decode unit memory 44 will then be sent down to OR gate 46 where it will be placed in the correct bit position of the word being read from AND gate 40. The output of OR gate 46 is the corrected word to be read out of the defect tolerant memory.

In operation the defect tolerant memory system stores words of data that may include extra bits for the detection and correction of errors. These error correction codes will correct individual bits upon a read command elsewhere in the computer system and algorithmically repair the memory. The algorithm consists of the maintenance and updating of an error log, an error limit per main memory bit or segment of bits, the interruption of the system upon limit detection, and the update of the mask memory to include the newly failed main memory cell(s). The hardware may be either the main computer system or a special dedicated unit within the defect tolerant memory. The bit-mask updated may be either additional sub-memory units of mask memory levels 28, 30, 32 also controlling $L_1$, $L_2$, $L_N$ or may be separate mask levels controlling additional levels of redundant memory or all mask memories may be written upon power up of the system of in the case of the use of nonvolatile memory as required.

What is claimed is:

1. A defect tolerant memory including a multi-chip main memory receiving data inputs and address commands to read and write data, said defect tolerant memory further comprising:

a redundant memory receiving said data inputs and address commands in parallel with said main memory to read, write and store data redundant to that contained in defective cells of said main memory, said redundant memory having multiple memory levels with each memory level having similar addresses, each similar address being representative of a segment of main memory, each said segment of main memory capable of containing multiple defects, the redundant data for each of said several defects being stored in a similar address of a different one of said memory levels, said redundant memory providing redundant data to addressed defective data as an output;

a mask memory receiving said address commands in parallel with said main memory and redundant memory for storing the sub-addresses of defective cells of said main memory, said mask memory made up of multiple bit-mask memories each cooperating with a different one of said redunant memory levels, each said bit-mask memory storing the sub-addresses of defective cells for a different redundant memory level, each bit-mask memory providing an enabling signal to its respective redundant memory level when a defective cell is addressed in the bit-mask memory, each said bit-mask memory having multiple sub-memory units, each said sub-memory unit having addresses each representative of a segment of main memory, each said address storing a word indicative of the location of a defective cell in the respective segment of said main memory, said multiple sub-memory units storing multiple addresses if multiple defects are found in a respective segment of main memory, said mask memory providing as an output an indication that a defective bit in main memory has been addressed.

2. The apparatus of claim 1 in which said words stored in addresses in said sub-memory units contain an indicator of the address of a defective word in the respective segment of main memory and a bit point indicator identifying the bit position of the defective bit.

3. The apparatus of claim 2 in which each said bit-mask memory includes a comparator which receives and compares said indication of the address of a defective word in the respective segment of main memory and a portion of said address command to provide an output which indicates that a defective bit in main memory has been addressed.

4. The apparatus of claim 2 in which said mask memory responds to said address command to provide said enabling signal indicating that a word in main memory having a defective bit has been addressed and a bit pointer indication of the bit location, said redunant memory responding to said address command and said enabling signal to provide as an output redundant information for correction of the defective bit.

5. The apparatus of claim 4 having a bit correction unit for receiving the outputs of said main memory, said mask memory, and said redundant memory for passing addressed words from main memory with no defective bits and replacing redundant data bits in the addressed words having defective cells.

6. The apparatus of claim 5 in which each said bit-mask memory includes a comparator which receives and compares said indication of the address of a defective word in the respective segment of main memory and a portion of said address command to provide an output which indicates that a defective bit in main memory has been addressed.

7. The appatatus of claim 5 having bit-select units which receive said data inputs and inputs from said mask memory when defective bits in main memory have been addressed, said bit-select units responding to said inputs from said mask memory to read said data into said redundant memories.

8. The apparatus of claim 7 in which each said redundant memory level contains a bit select unit for reading a data input into the respective redundant memory level.

9. The apparatus of claim 8 in which the input from said mask memory to said bit select units is a bit pointer indication.

10. In a defect tolerant memory including a multi-chip main memory receiving data inputs and address commands to read and write data, the improvement comprising:

a redundant memory receiving said data inputs and address commands in parallel with said main memory to read, write and store information redundant to that addressed to the defective bits of said multi-chip main memory, said redundant memory having multiple memory levels with each representative of a segment of addresses in said main memory, said addresses capable of storing redundant data for main memory defects, the redundant data for each of said several defects being stored in a similar address location of a different one of said memory levels.

11. In a defect tolerant memory including a multi-chip main memory receiving data inputs and address commands to read and write data, the improvement comprising:

a mask memory for storing the sub-addresses of defective cells of said multi-chip main memory, said mask memory receiving said address commands in parallel with said main memory, said mask memory having multiple bit-mask memories, each said bit-mask memory having multiple sub-memory units, each sub-memory unit having addresses each representative of addresses of said main memory, each said address storing a word indicative of the location of a defective cell in said main memory, multiple sub-memory units each storing one of the multiple words for multiple defects found in one segment of main memory, said mask memory providing as an output an indication that a defective bit in main memory has been addressed.

12. A defect tolerant memory for a computer system, the computer system providing a source of address commands and a source of data, the defect tolerant memory comprising:

a main memory having addressable locations for storing multiple bit words with some storage cells in known addresses being defective, said main memory receiving said address command and said data;

a redundant memory receiving said data inputs and address commands to read, write and store data redundant to that contained in said defective cells, said redundant memory having multiple memory levels with each memory level having similar addresses being representative of a segment of main memory, said segment of addresses capable of containing multiple defects, the redundant data for each of said several defects being stored in a similar address of a different one of said memory levels, each memory level receiving said data and said address commands, said redundant memory providing redundant data as an output;

a mask memory receiving said address commands for storing the sub-addresses of said defective cells of said main memory, said mask memory made up of multiple bit-mask memories each cooperating with a different one of said redundant memory levels, each said bit-mask memory having multiple sub-memory units, each said sub-memory unit having addresses each representative of a segment of main memory, each said address storing a word indicative of the address of a defective word in the respective segment of said main memory and a bit point indication identifying the bit position of the defective bit, said multiple sub-memory units storing multiple words if multiple defects are found in the respective segment of main memory, each of said sub-memory units receiving and comparing said address commands to the stored locations of said defective words to provide an indication of the bit location, said indication of an addressed defective word being provided to said redundant memory to act in cooperation with said data and address commands to read and write redundant data for defective bits in and out of redundant memory;

a bit-correction unit receiving the outputs of said main memory, said mask memory, and said redundant memory for passing addressed words from main memory with no defective bits and replacing data bits in the addressed words having defective cells indicated by said bit pointer output of said bit mask memory; and, each said redundant memory level having a bit select unit which receives said source data, and said bit pointer output of said mask memory for enabling the storage of redundant data bits in said redundant memory for each addressed defective cell in main memory.

* * * * *